United States Patent
Anceau

(10) Patent No.: US 7,560,391 B2
(45) Date of Patent: Jul. 14, 2009

(54) FORMING OF TRENCHES OR WELLS HAVING DIFFERENT DESTINATIONS IN A SEMICONDUCTOR SUBSTRATE

(75) Inventor: Christine Anceau, Saint Roch (FR)

(73) Assignee: STMicroelectronics S.A., Montrouge (FR)

( * ) Notice: Subject to any disclaimer, the term of this patent is extended or adjusted under 35 U.S.C. 154(b) by 508 days.

(21) Appl. No.: 11/318,369

(22) Filed: Dec. 23, 2005

(65) Prior Publication Data

US 2006/0141793 A1    Jun. 29, 2006

(30) Foreign Application Priority Data

Dec. 23, 2004    (FR) .................................... 04 53170

(51) Int. Cl.
*H01L 21/302*    (2006.01)
(52) U.S. Cl. .................. 438/723; 438/425; 438/700; 438/702; 438/706
(58) Field of Classification Search ................ 438/700, 438/706, 702, 710, 425, 437, 723, 763
See application file for complete search history.

(56) References Cited

U.S. PATENT DOCUMENTS

| 5,049,521 | A | * | 9/1991 | Belanger et al. ............ 438/295 |
| 5,473,186 | A | | 12/1995 | Morita et al. |
| 5,909,618 | A | | 6/1999 | Forbes et al. |
| 5,920,778 | A | * | 7/1999 | Rosner et al. ............... 438/270 |
| 6,207,534 | B1 | | 3/2001 | Chan et al. |
| 6,787,878 | B1 | | 9/2004 | Nagai et al. |
| 6,794,254 | B1 | | 9/2004 | Tzeng et al. |
| 6,946,359 | B2 | * | 9/2005 | Yang et al. .................. 438/425 |
| 2004/0132288 | A1 | | 7/2004 | Shepard |

OTHER PUBLICATIONS

French Search Report from French Patent Application No. 04/53170, filed Dec. 23, 2004.

* cited by examiner

*Primary Examiner*—Lan Vinh
(74) *Attorney, Agent, or Firm*—Lisa K. Jorgenson; James H. Morris; Wolf, Greenfield & Sacks, P.C.

(57) ABSTRACT

A method for forming, in a semiconductor substrate, wells and/or trenches having different destinations, including the steps of at least partly simultaneously etching cavities according to the pattern of the trenches and/or wells; closing the openings of the cavities with at least one first non-conformal thick layer, and selectively opening the first thick layer according to the subsequent processings.

21 Claims, 3 Drawing Sheets

FORMING OF TRENCHES OR WELLS HAVING DIFFERENT DESTINATIONS IN A SEMICONDUCTOR SUBSTRATE

BACKGROUND OF THE INVENTION

1. Field of the Invention

The present invention generally relates to the manufacturing of active and/or passive integrated circuits, and more specifically to the forming of trenches and/or of wells having different destinations in a semiconductor substrate.

In the present description, "trenches" is used to designate a cavity having, in top view, an elongated shape, for example, a strip shape that may extend in a closed contour, and "well" is used to designate a cavity having in top view a compact shape, for example, a square or a circle.

The present invention applies to the forming, in the same substrate, for example, made of silicon, of at least two elements, such as contacts towards buried layers, substrate contacts, dielectric insulation areas, tridimensional capacitances, etc.

2. Discussion of the Related Art

In prior art, when it was, for example, desired to form a well for a contact to a buried layer and a trench for a tridimensional capacitance in the same substrate, the corresponding etchings used to be separately performed, due to the incompatibility in the processings performed in the well and trench after etching.

More generally, to perform different dopings or oxidations in two groups of trenches or of wells, one should etch, dope, or oxidize, then separately fill the two formed groups of these trenches and holes.

SUMMARY OF THE INVENTION

The present invention aims at forming, in the same semiconductor substrate, wells and/or trenches or the like having different destinations while avoiding a completely separate etch of these wells or trenches.

The present invention also aims at providing a solution which is compatible with the forming of conductive or insulating wells or trenches.

The present invention also aims at providing the forming of wells or trenches having different depths.

To achieve all or part of these objects, the present invention provides a method for forming, in a semiconductor substrate, wells and/or trenches having different destinations, comprising at least the steps of simultaneously etching the trenches and/or wells; closing the openings of the cavities with at least one first non-conformally deposited thick layer; and selectively opening the first thick layer according to the subsequent processings.

According to an embodiment of the present invention, a silicon nitride layer is deposited, after etching and before deposition of said first thick layer, over the entire structure, including in the cavities.

According to an embodiment of the present invention, all cavities are formed in a single etch step, their depths being set by their respective widths.

According to an embodiment of the present invention, a first cavity group extends to a buried insulating layer, a second group of cavities being of a smaller depth.

According to an embodiment of the present invention, manufacturing steps dedicated to a first cavity group are performed by opening said first thick layer at the level of these cavities only.

According to an embodiment of the present invention, a second thick insulating layer is non-conformally deposited over the entire structure to temporarily close the cavities of the first group.

According to an embodiment of the present invention, a group of cavities is used to form a multidimensional capacitance.

According to an embodiment of the present invention, the thick layer(s) are silicon oxide.

BRIEF DESCRIPTION OF THE DRAWINGS

The foregoing and other objects, features, and advantages of the present invention will be discussed in detail in the following non-limiting description of specific embodiments in connection with the accompanying FIGS. 1 to 8 which illustrate, in simplified cross-section views, different steps of the forming of trenches and wells in a silicon substrate according to an embodiment of the present invention.

DETAILED DESCRIPTION

Figure 1:
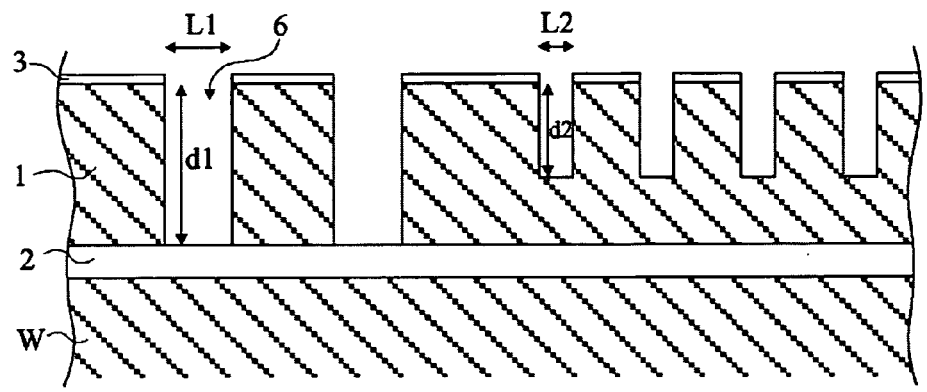

For clarity, the same elements have been designated with the same reference numerals in the different drawings and, as usual in the representation of integrated components, the various drawings are not to scale. Further, only those steps which are useful to the understanding of the present invention have been shown in the drawings and will be described hereafter. In particular, the forming of possible active circuits has not been described in detail, the present invention being compatible with any conventional technique.

The present invention will be described hereafter in relation with an example of the forming of a tridimensional capacitance, of a well or trench forming a substrate contact area, and of a dielectric insulating trench in a substrate of silicon-on-insulator type (SOI). However, the present invention more generally applies whatever the type of concerned substrate (solid or not) and whatever the destinations of the wells and/or trenches (insulating or conductive) formed in this substrate, provided that at least two of these wells or trenches have different destinations requiring, after etching, distinct steps.

Figure 2:
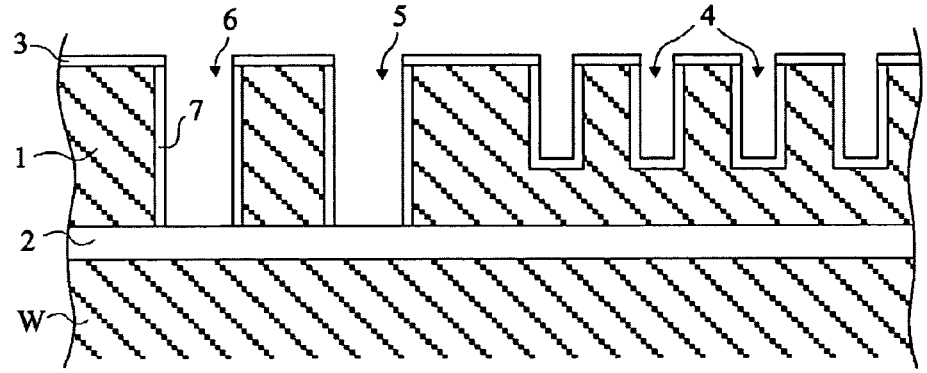
Figure 3:
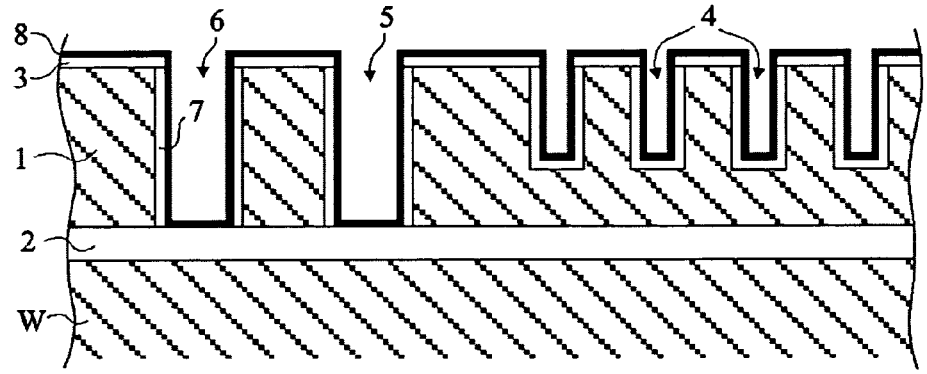
Figure 4:
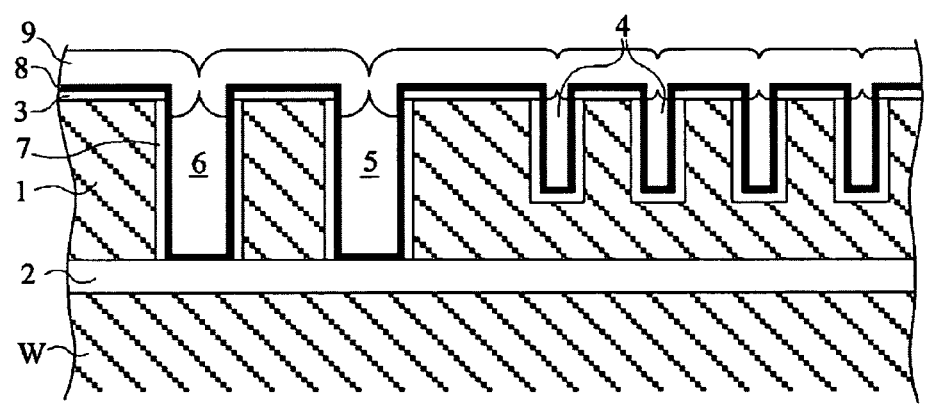
Figure 5:
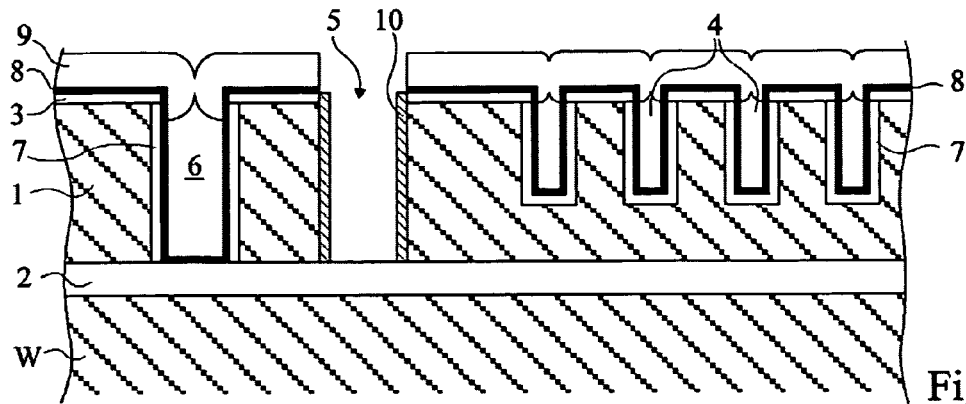
Figure 6:
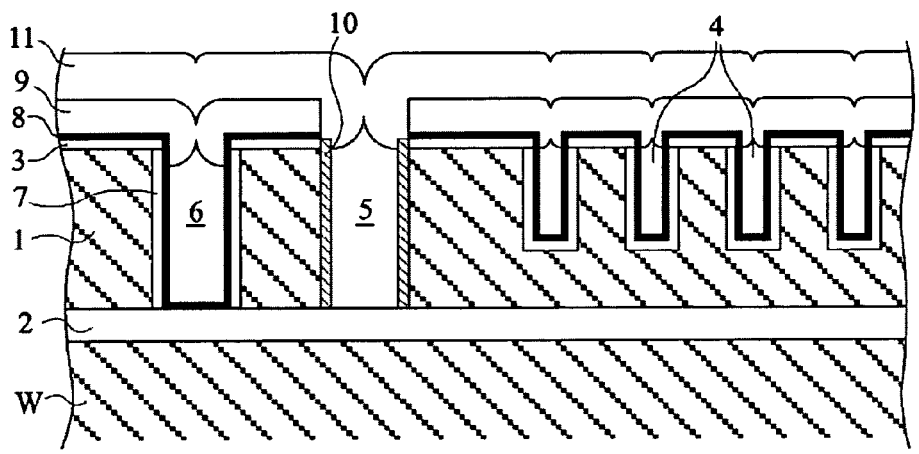
Figure 7:
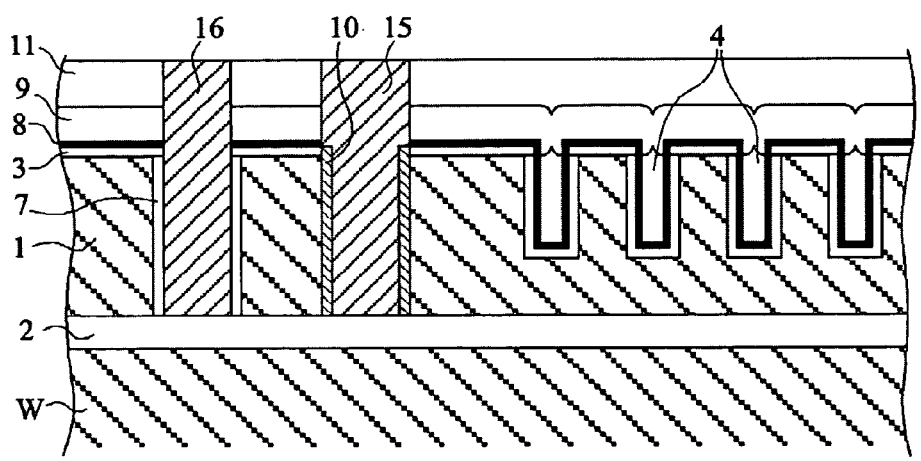
Figure 8:
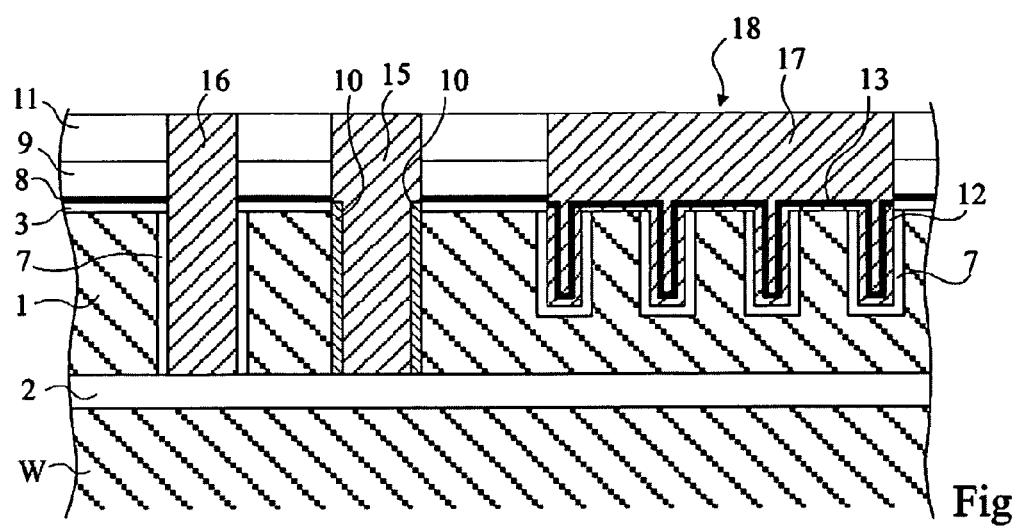

FIGS. 1 to 8 are very simplified cross-section views of trench and well manufacturing steps in an SOI substrate according to an embodiment of the present invention.

It is started from a thin single-crystal silicon substrate 1, for example, of type N, on an insulating layer 2 (for example, silicon oxide) supported by a wafer W (for example, made of silicon). Active areas (not shown) are likely to have been previously formed in substrate 1.

In a first step (FIG. 1), an insulating layer 3, for example, silicon oxide ($SiO_2$), is deposited (or thermally obtained) on the upper surface of substrate 1. Then, a masking and a deep etch are performed to dig wells and trenches 4, 5, and 6. For example, well 5 and trench 6 have a same depth, d1, reaching layer 2, while trenches 4 have a smaller depth, d2. Such different depths can be obtained in a same anisotropic etch step by providing for trenches 4 to have a width L2 smaller than width L1 of well and trench 5 and 6. For example, widths L1 and L2 respectively are on the order of 1.2 µm and of 0.8 µm.

Trenches 4 are, for example, intended to form a tridimensional capacitance; in top view, this might be trenches in the form of parallel strips or an array of wells. Well 5 is intended for a substrate contact area; in top view, this may be a local well, a strip-shaped trench, or yet a peripheral trench. Trench 6 is intended to form a dielectric insulation area; in top view, it will be a peripheral trench.

In a second step (FIG. 2), an oxidation is carried out (for example, a thermal oxidation) to form an oxide layer 7 in the walls of the wells and trenches. This oxide layer is also formed in the bottom of trenches 4 which do not reach layer 2. As a specific example of embodiment, layer 7 has a thickness on the order of from 0.1 to 0.2 µm.

In a third step (FIG. 3), a silicon nitride layer 8 ($Si_3N_4$) is deposited over the entire structure. Layer 8 will be used as a stop layer for the different subsequent etchings and covers the walls and the bottom of cavities 4, 5, and 6. The thickness of the silicon nitride layer is, for example, approximately 0.01 µm.

In a fourth step (FIG. 4), a silicon oxide layer 9, relatively thick as compared with layers 3 and 7, is deposited by non-conformal deposition over the entire structure. The thickness of layer 9 is at least equal to half the width, preferably approximately equal to the width, of the widest trenches and wells (well 5 and trench 6 in this example). Layer 9 forms caps or plugs at the top of all the trenches and wells. Preferably, the cavities formed according to the present invention have a maximum width of approximately 2 µm and layer 9 is then deposited with a thickness slightly greater than 1 µm.

Any non-conformal deposition technique is appropriate to implement this fourth step, for example, a plasma-assisted chemical vapor deposition (PECVD) or a physical vapor deposition (PVD).

In a fifth group of steps (FIG. 5), thick layer 9 is opened at the level of well 5 to make it accessible. Nitride layer 8 is then eliminated by wet etch from the walls and the bottom of well 5 and oxide layer 7 is eliminated by wet etch from the walls of well 5. Then, the walls are doped, for example, by phosphorus diffusion, to form a heavily-doped N-type layer 10.

In a sixth step (FIG. 6), a new thick oxide layer 11 is non-conformally deposited to close well 5.

In a seventh step (FIG. 7), layer 11 above well 5 and layers 9 and 11 above trench 6 are etched to make well 5 and trench 6 accessible. Layer 9 could be directly opened above trench 6 without closing back hole 5. However, the etching of silicon oxide 9 would also etch silicon oxide 3 at the bottom of the hole, which would then no longer be protected. It is thus preferred to close well 5 with layer 11 to prepare a simultaneous etch without going too far. At this step, the silicon nitride may be removed by wet etch. Well 5 and trench 6 are then integrally filled by conformal deposition to obtain in this well and this trench fillings 15 and 16. Filling material 16 of trench 6 may indifferently be conductive or insulating, the insulation being performed by layers 7 and possibly 8. However, since filling material 15 of well 5 must be conductive, the same conductive material, for example, phosphorus-doped polysilicon, is used. The surface localization of this polysilicon may be performed by a planarization technique.

The forming of an insulation trench and of a substrate contact area has thus been completed.

In an eighth step (FIG. 8), thick oxide layers 9 and 11 are etched at the level of trenches 4. Silicon nitride layer 8 is used as an etch stop layer protecting the trenches and is removed once the silicon oxide has been completely eliminated.

The forming of the capacitance is conventional. For example, the first electrode is formed by a first polysilicon layer 12 deposited on the walls and on the bottom of trenches 4. Layer 12 is covered with an insulating layer 13, for example, silicon nitride. Then, a polysilicon layer 17 is deposited again to form the second electrode, and fill the trench. A multidimensional capacitance 18 is thus obtained.

According to a variation, thick oxide layer 9, deposited at the fourth step (FIG. 4) of the above-described sequence, is also used as an etch mask for the case where the respective etchings of the trenches and of the wells only have a common portion due to too high a depth difference.

An advantage of a non-conformal deposition in the trenches and wells to be closed is to avoid the cleaning steps to deoxidize the deep trenches and wells.

Another advantage of the present invention is that it enables forming at least one common etch portion which is a particularly long step in the trench and well forming, while these trenches and wells have different final destinations.

Of course, the present invention is likely to have various, alterations, improvements, and modifications which will readily occur to those skilled in the art. In particular, three specific types of wells and trenches having specific functions have been described herein. Wells and trenches having other functions may be provided, other types of wall layers and other filling types may be provided. The practical implementation of the present invention based on the functional indications given hereabove and by using techniques currently used in the microelectronics is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, in a semiconductor substrate, cavities having different destinations, comprising at least the steps of:

simultaneously etching the cavities in the semiconductor substrate to create openings, wherein cavities of a first cavity group extend to a buried insulating layer at a first depth, and cavities of a second cavity group extend to a second depth, with the second depth being less than the first depth;

closing the openings of the cavities by depositing at least one first non-conformally thick layer; and opening the first thick layer to make at least one cavity of the first cavity group accessible while the cavities of the second cavity group are closed;

opening the first thick layer to make the cavities of the second cavity group accessible while the cavities of the first cavity group are closed.

2. The method of claim 1, further comprising depositing a silicon nitride layer over the substrate including in the cavities, after etching and before depositing said first thick layer.

3. The method of claim 1, wherein simultaneously etching the cavities comprises forming all the cavities in a single etch step, a depth of a cavity being a function of a width of the cavity.

4. The method of claim 1, wherein the second cavity group is used to form a multidimensional capacitance.

5. The method of claim 1, wherein the at least one thick layer comprises silicon oxide.

6. The method of claim 1, wherein the cavities comprise wells.

7. The method of claim 1, wherein the cavities comprise trenches.

8. The method of claim 1, wherein the cavities comprise wells and trenches.

9. The method of claim 1, wherein manufacturing steps dedicated to the first cavity group are performed by opening said first thick layer at a level of the first cavity group only.

10. The method of claim 9, further comprising non-conformally depositing a second thick insulating layer over the substrate and the openings to temporarily close the cavities of the first cavity group.

11. The method of claim 10, further comprising opening the second thick insulating layer by etching to make at least one of the cavities of the first cavity group accessible.

12. The method of claim 11, further comprising opening the first thick layer by etching to make at least one of the cavities of the first cavity group accessible.

13. The method of claim 12, further comprising integrally filling the cavities of the first cavity group.

14. The method of claim 13, further comprising opening the first and second thick layers by etching to make cavities of the second cavity group accessible.

15. The method of claim 14, wherein at least one of the cavities of the first cavity group has a depth that is different from at least one of the cavities of the second cavity group.

16. The method of claim 13, wherein each of the cavities of the first cavity group has a depth that is different from each of the cavities of the second cavity group.

17. A method for forming cavities of different depths in a semiconductor substrate comprising:
   simultaneously etching first and second cavities in the semiconductor substrate, each cavity having an opening and a depth, wherein the first cavity extends to a buried layer at a first depth, and the second extends to a second depth, the second depth being different than the first depth;
   depositing a first non-conformal layer on the semiconductor substrate to close the openings of the cavities;
   opening the first layer to expose the opening of the first cavity;
   performing a first step in the first cavity while the second cavity is closed and the first cavity is exposed by the opening of the first layer;
   opening the first layer to expose the opening of the second cavity; and
   performing a second step in the second cavity while the first cavity is closed and the second cavity is exposed by the opening of the first layer.

18. The method of claim 17, further comprising depositing a second non-conformal layer which closes the opening of the first cavity opening and overlies the first layer.

19. The method of claim 17, wherein the second step which is performed in the second cavity is distinct from the first step which is performed in the first cavity.

20. The method of claim 18, further comprising opening the first and second layers to expose the opening of the second cavity.

21. The method of claim 20, wherein opening the first and/or second layers comprises etching the first and/or second layers.

* * * * *